(12) United States Patent
Lian et al.

(10) Patent No.: US 7,270,884 B2
(45) Date of Patent: Sep. 18, 2007

(54) ADHESION LAYER FOR PT ON SIO$_2$

(75) Inventors: Jingyu Lian, Wallkill, NY (US); Kwong Hon Wong, Wappingers Falls, NY (US); Michael Wise, Larangeville, NY (US); Young Limb, Poughkeepsie, NY (US); Nicolas Nagel, Yokohama (JP)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/408,339

(22) Filed: Apr. 7, 2003

(65) Prior Publication Data
US 2004/0197576 A1    Oct. 7, 2004

(51) Int. Cl.
*B32B 9/06*    (2006.01)
(52) U.S. Cl. .................. 428/446; 428/450; 428/469; 428/630; 428/670
(58) Field of Classification Search ................ 428/446, 428/450, 469, 698, 630, 670
See application file for complete search history.

(56) References Cited

U.S. PATENT DOCUMENTS

| | | | |
|---|---|---|---|
| 5,960,252 A * | 9/1999 | Matsuki et al. ............... 438/3 |
| 6,146,906 A * | 11/2000 | Inoue et al. .................... 438/3 |
| 6,271,083 B1 * | 8/2001 | Lou ............................ 438/253 |
| 6,365,420 B2 | 4/2002 | Ashida | |
| 6,376,325 B1 * | 4/2002 | Koo ........................... 438/396 |
| 6,501,113 B2 | 12/2002 | Tsunemine et al. | |
| 6,566,220 B2 * | 5/2003 | Engelhardt et al. ......... 438/393 |
| 6,645,632 B2 | 11/2003 | Honda et al. | |
| 6,645,807 B2 * | 11/2003 | Tsuzumitani et al. ....... 438/243 |
| 6,686,265 B2 * | 2/2004 | Beitel et al. ................. 438/597 |
| 6,800,937 B2 | 10/2004 | Marsh et al. | |
| 2002/0115253 A1 | 8/2002 | Engelhardt et al. | |
| 2002/0151162 A1 | 10/2002 | Beitel et al. | |
| 2003/0047784 A1 | 3/2003 | Joo | |

FOREIGN PATENT DOCUMENTS

| | | |
|---|---|---|
| JP | 11307736 A * | 11/1999 |
| KR | 362198 B * | 11/2002 |
| WO | WO 0129885 A2 * | 4/2001 |

OTHER PUBLICATIONS

Gniewek, J., et al., "Enhancement of Pt Adhesion Using a Si Underlay," IBM Technical Disclosure Bulletin, Aug. 1977, vol. 20, No. 3, p. 1009.

* cited by examiner

*Primary Examiner*—Jennifer McNeil
*Assistant Examiner*—Timothy M. Speer
(74) *Attorney, Agent, or Firm*—Slater & Matsil, L.L.P.

(57) ABSTRACT

Si, Al, Al plus TiN, and IrO2 are used as adhesion layers to prevent peeling of noble metal electrodes, such as Pt, from a silicon dioxide (SiO$_2$) substrate in capacitor structures of memory devices.

24 Claims, 3 Drawing Sheets

ADHESION LAYER FOR PT ON SIO$_2$

BACKGROUND OF THE INVENTION

The present invention relates to integrated circuit (IC) memory devices and, more particularly, to the inclusion of one or more thin layers, such as Si, Al, IrO$_2$, or Al plus TiN, as an adhesion layer between a noble metal layer, such as Pt, and a silicon dioxide (SiO$_2$)layer to form the electrode for high-k dielectric Dynamic Random Access Memory (DRAM) and Ferroelectric Random Access Memory (FRAM) applications.

Capacitors with high dielectric constant (high-k) materials as the dielectric are increasingly used in high density devices. The high-k dielectrics used in DRAM devices are generally formed at a high temperature oxidation ambient, as are ferroelectric materials used in FRAM devices. To avoid oxidation of the electrodes at these high temperatures, noble metal electrodes are used with the dielectric. Platinum (Pt) electrodes are typically used for the high-k dielectric capacitors in DRAM devices and for FRAM devices because of its excellent oxidation resistance and high work function. However, Pt poorly adheres to silicon dioxide and results in peeling of the Pt at various process steps, such as during the formation of the capacitor and during the following Back End of Line (BEOL) processes. To prevent peeling, an intermediate adhesion layer may be added between the Pt and SiO$_2$ layers. Currently, the adhesion layers used include Ti, TaSiN or TiN.

Though these materials can improve the adhesion between the Pt and SiO$_2$ layers in the "as-deposited" state, roughening of the Pt surface or a local peeling has been observed after the subsequent annealing step which is typically at a temperature of 500 to 580° C. in an oxygen ambient. Further, when high-k dielectric and ferroelectric layers are deposited at temperatures below 500° C., the layers have degraded film quality with decreased capacitance, which degrades the performance of the device.

It is therefore desirable to provide an improved adhesion layer between the noble metal electrodes and the SiO$_2$ layers. It is also desirable to provide an adhesion layer that prevents the peeling of the noble metal electrodes of the capacitor structures.

SUMMARY OF THE INVENTION

The present invention provides one or more adhesion layers which prevent the Pt electrode from peeling from the SiO$_2$. Such layers include IrO$_2$, Si, Al, or Al plus TiN as the adhesion layer.

According to an aspect of the invention, in a semiconductor capacitor structure formed on a silicon dioxide (SiO$_2$) substrate and having a noble metal electrode, an adhesion layer is disposed between the electrode and the SiO$_2$ substrate. The adhesion layer is selected from a group consisting of silicon (Si), aluminum (Al), aluminum (Al) plus titanium nitride (TiN) and iridium oxide (IrO$_2$).

According to a further aspect of the invention, an adhesion layer is selected from a group consisting of Si, Al, Al plus TiN, and IrO$_2$ and is disposed between a noble metal layer and a silicon dioxide layer.

According to another aspect of the invention, a high dielectric constant (high-k) capacitor structure is fabricated. An adhesion layer is deposited on a SiO2 substrate. The adhesion layer is selected from a group consisting of Si, Al, Al plus TiN, and IrO$_2$. A noble metal bottom electrode is deposited on the adhesion layer.

In accordance with this aspect of the invention, a high-k dielectric material is deposited on the bottom electrode. A top electrode is deposited on the high-k dielectric layer, and the top electrode and the high-k dielectric are patterned. An insulation layer is deposited thereon, and vias are opened in the insulation layer. A metal pad layer is deposited in the vias and atop the insulation layer, and the metal pad layer is patterned.

According to a still further aspect of the invention, a 3-dimensional capacitor structure is fabricated. A silicon dioxide layer is deposited on a substrate, and vias are opened in the silicon dioxide layer. Polycrystalline silicon is deposited into the vias, and the polycrystalline silicon is planarized and recessed back to form poly plugs in the vias. A barrier layer is deposited in the vias, and the barrier layer is planarized. An adhesion layer is deposited atop the barrier layer and the SiO$_2$ layer. The adhesion layer is selected from a group consisting of Si, Al, Al plus TiN, and IrO$_2$. A noble metal bottom electrode is deposited on the adhesion layer.

BRIEF DESCRIPTION OF THE DRAWINGS

The foregoing and other objects, aspects and advantages will be better understood from the following detailed description of the invention with reference to the drawings in which.

DETAILED DESCRIPTION OF THE INVENTION

The invention is directed to the use of one or more layers, such as IrO$_2$, Si and Al plus TiN, that improve adhesion between an electrode layer and a SiO2 layer.

Figure 1:
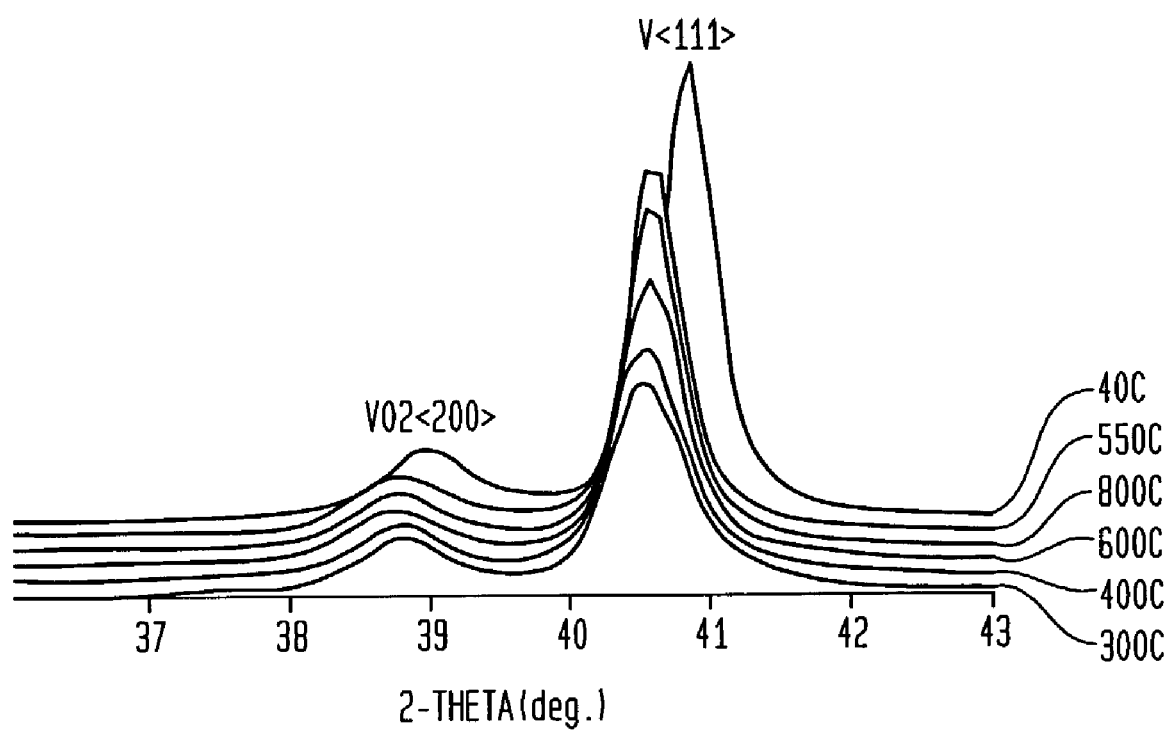
FIG. 1 is a graph illustrating x-ray diffraction analysis data and showing the stability of IrO$_2$ at temperatures of up to 750° C.

IrO$_2$, as an example, has a good adhesion to silicon oxide as can be predicted by its oxygen bonding nature. IrO$_2$ remains stable up to 750° C. when exposed to an oxygen ambient, as shown in FIG. 1. Further, polycrystalline IrO$_2$ is conductive and can serve as a part of the electrode.

Alternatively, thin Si or Al layers can form a uniform thin silicon oxide or aluminum oxide layer underneath a Pt electrode to improve the adhesion of Pt on SiO$_2$ layer without decreasing dielectric film quality on the Pt.

TABLE 1

Adhesion Test Results

| Adhesion Layer and Thickness | Pt Thickness | Adhesion (Mpam1/2) |
|---|---|---|
| None | 1000 Å | Failed |
| TiN, CVD, 50 Å | 1000 Å | <0.16 |
| TaSiN, 250 Å | 2500 Å | 0.24 |
| Ti, PVD, 50 Å | 1000 Å | 0.26 |
| Al, 100 Å | 1000 Å | 0.23 |

TABLE 1-continued

Adhesion Test Results

| Adhesion Layer and Thickness | Pt Thickness | Adhesion (Mpam1/2) |
| --- | --- | --- |
| Al, 100 Å, +Ti, 200 Å | 1000 Å | 0.32 |
| Poly Si, 50 Å | 1000 Å | 0.30 |

Table 1 shows the adhesion properties of various materials after exposure in an oxygen ambient at 640° C. for five minutes. Samples with a known chemical vapor deposited (CVD) TiN adhesion layer could not be tested since its adhesion was less than 0.16. Samples with known Ti or TaSiN adhesion layers had improved adhesion over the CVD physical vapor deposition (PVD) but were not suitable because of dielectric layer degradation on a Pt/Ti or TaSiN/$SiO_2$ structure. Better or at least comparable adhesion was obtained for samples with a polycrystalline Si, Al, or Al plus Ti adhesion layers of the invention.

Figure 2:
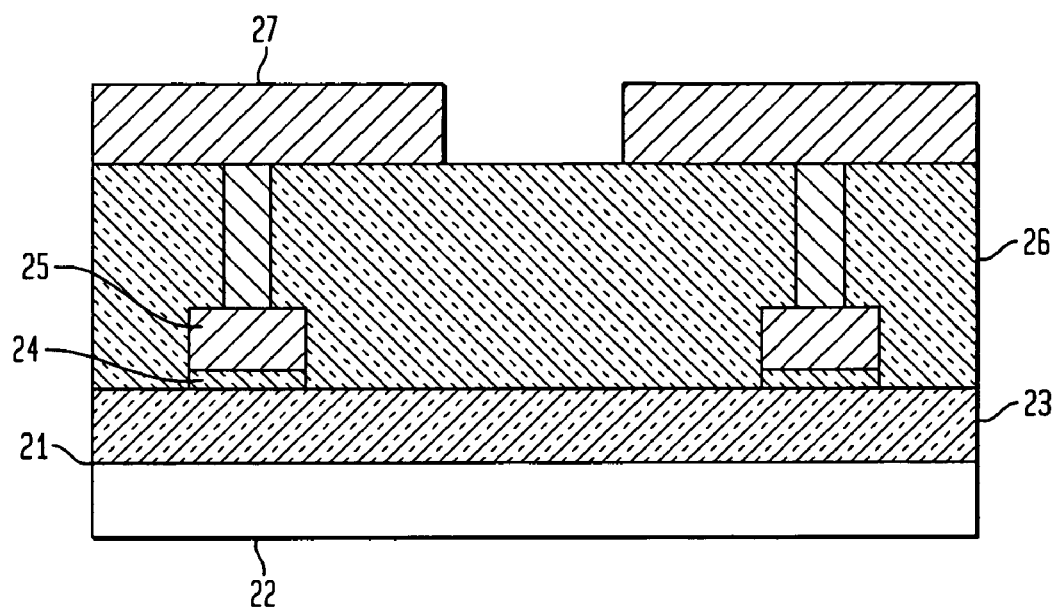
FIG. 2 is a cross-sectional view showing a planar capacitor structure of a device according to an embodiment of the invention.

To test the adhesion, a planar capacitor structure, such as is shown in FIG. 2, was prepared by first depositing an adhesion layer 21 on a $SiO_2$ layer atop a substrate (not shown). The adhesion layer is preferably Si, Al, Al plus Ti or $IrO_2$. A Pt bottom electrode 23 is then deposited atop the adhesion layer 21. A high-k dielectric 24 is then deposited atop the adhesion layer, and a top electrode 25 (Pt) is deposited thereon. The high-k dielectric may be a (Ba,Sr)$TiO_3$ (BST) material. The top electrode 25 and the high-k dielectric 24 are then patterned and an insulation ($SiO_2$) layer 26 is thereafter deposited atop this structure. Vias are then opened in the $SiO_2$, and a Al or W a metal pad layer 27 is deposited in and on top of the vias and is then patterned.

Electrical testing results using the planar capacitor structure shown in FIG. 2 show essentially no change in the capacitance of the dielectric layer when using a poly Si adhesion layer, as Table 2 shows.

TABLE 2

Electrical Test Results

| Adhesion Layer | Capacitance (pF) |
| --- | --- |
| None | 350-400 |
| Poly Si, 50 Å | 350-400 |

The adhesion layers of the invention may be used in any integration scheme where adhesion of the electrode to the $SiO_2$ layer is of importance. Without limiting the scope of the invention, two examples using three-dimensional capacitor structures on devices for a DRAM application are now described.

Figure 3:
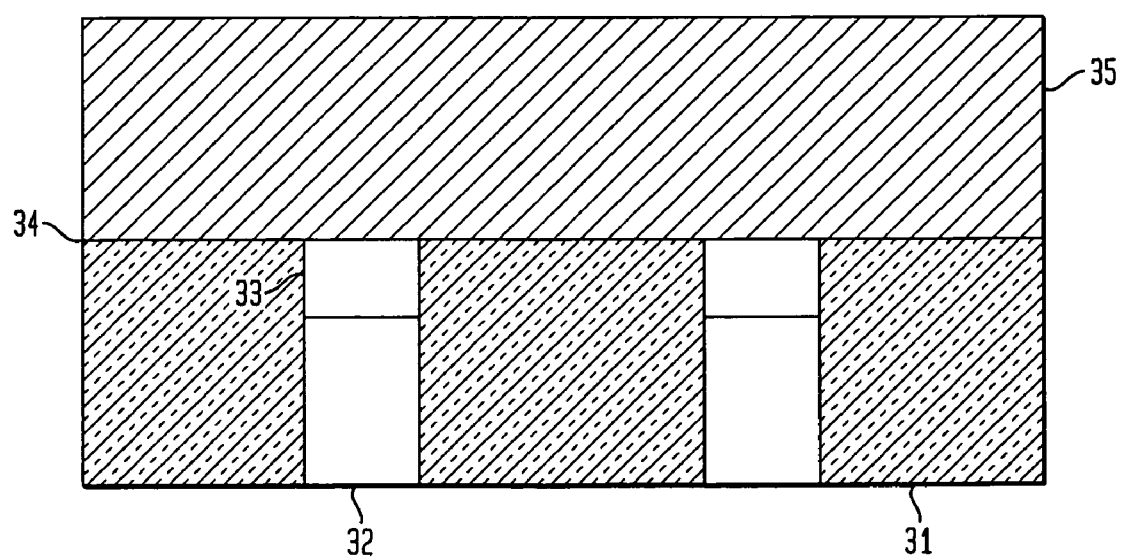
FIG. 3 is a cross-sectional view showing a first three-dimensional capacitor structure of a device according to another embodiment of the invention.

Referring to FIG. 3, a $SiO_2$ layer 31 is formed on a device substrate (not shown). Vias are opened in the $SiO_2$ layer 31, and a polycrystalline Si layer 32 is deposited on top of the $SiO_2$ and into the vias. The polycrystalline Si is planarized to remove any material atop the $SiO_2$ layer, using a chemical mechanical polish (CMP) process, and the polysilicon is then recessed back, leaving poly plugs in the vias between the surface of the $SiO_2$ layer. Next, a barrier layer 33 is deposited atop the $SiO_2$ layer and the poly plugs, and the barrier layer is likewise subjected to a CMP process. An adhesion layer 34 is then deposited, and a Pt bottom electrode 35 is deposited atop the adhesion layer. If a conductive adhesion layer is used, such as $IrO_2$ the bottom electrode is deposited directly onto the adhesion layer. Alternatively, if a non-conductive adhesion layer is used, the part of the adhesion layer that is over the barrier layer is removed, and then the bottom electrode 35 is then deposited. Thereafter, the bottom electrode layer is patterned to form a three-dimensional structure (not shown). A high-k dielectric, such as BST, is then deposited and is covered with Pt top electrode layer to form the capacitor structure.

Figure 4:
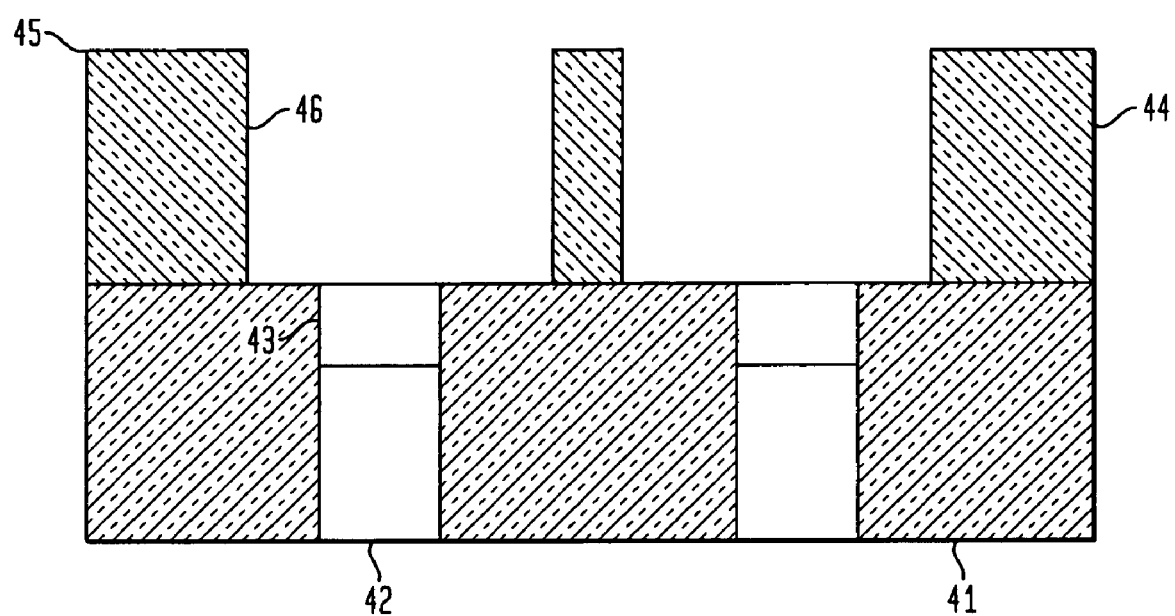
FIG. 4 is a cross-sectional view showing a second three-dimensional capacitor structure of a device according to a further embodiment of the invention.

An alternative three-dimensional structure is shown in FIG. 4. First, a $SiO_2$ layer 41 is deposited on a device substrate (not shown). Vias are then opened in the $SiO_2$ layer, and a polycrystalline Si layer 42 is formed in the vias and atop the $SiO_2$. The polycrystalline Si is then planarized using a CMP process and recessed back, thereby leaving poly plugs in the vias. Next, a barrier layer 43 is deposited and subjected to a CMP process. A $SiO_2$ layer 44 is deposited and then patterned to form a three-dimensional structure, and an adhesion layer 45 is deposited thereon. A bottom (Pt) electrode 46 is deposited directly on the adhesion layer when the adhesion layer is conductive, such as when $IrO_2$ is used. Alternatively, the adhesion layer is removed in the regions above the barrier layer 43 and the bottom electrode is thereafter deposited. The top planar part of the bottom electrode 46 is then removed (not shown), and a high-k dielectric, such as BST, is deposited and covered with a Pt layer to form capacitors.

While the invention has been described in terms of preferred embodiments, those skilled in the art will recognize that the invention can be practiced with modification within the spirit and scope of the appended claims.

The invention claimed is:

1. An adhesion layer, comprising:
at least one layer of Si in contact with a noble metal layer and in contact with a silicon dioxide ($SiO_2$) layer.

2. The adhesion layer recited in claim 1 wherein the noble metal layer comprises Pt.

3. The adhesion layer recited in claim 1 wherein the noble metal layer is an electrode of a high-k dielectric capacitor.

4. The adhesion layer recited in claim 3 wherein the capacitor is included in a memory device.

5. In a semiconductor capacitor structure formed on a silicon dioxide ($SiO_2$) layer and having a noble metal electrode, the structure comprising:
an adhesion layer of Si disposed between the noble metal electrode and the $SiO_2$ layer and adhering to the noble metal electrode and to the SiO2 layer.

6. The structure recited in claim 5 wherein the noble metal electrode comprises Pt.

7. The structure recited in claim 5 wherein the capacitor structure is included in a memory device.

8. The structure recited in claim 5 wherein the adhesion layer is $IrO_2$.

9. A memory device, comprising:
a silicon dioxide ($SiO_2$) layer;
a capacitor comprising a noble metal electrode formed on the $SiO_2$ layer; and
a Si adhesion layer disposed between and in physical contact with the noble metal electrode and the $SiO_2$ layer.

10. The memory device recited in claim 9 wherein the noble metal electrode comprises Pt.

11. The memory device recited in claim 9 wherein the capacitor includes a high-k dielectric layer disposed on the noble metal electrode.

12. The memory device recited in claim 11 wherein the capacitor comprises another electrode disposed on the high-k dielectric layer.

13. An adhesion layer, comprising:
a Si layer disposed between and adhering to a noble metal layer and a silicon oxide layer.

14. The adhesion layer recited in claim 13 wherein the noble metal layer comprises Pt.

15. The adhesion layer recited in claim 13 wherein the noble metal layer is an electrode of a high-k dielectric capacitor.

16. The adhesion layer recited in claim 15 wherein the capacitor is included in a memory device.

17. The adhesion layer recited in claim 13 wherein the silicon oxide layer comprises $SiO_2$.

18. In a semiconductor capacitor structure formed on a silicon oxide layer and having a noble metal electrode, the structure comprising:
a Si adhesion layer physically contacting both the noble metal electrode and the silicon oxide layer.

19. The structure recited in claim 18 wherein the noble metal electrode comprises Pt.

20. The structure recited in claim 18 wherein the capacitor structure is included in a memory device.

21. A memory device, comprising:
a silicon oxide layer;
a capacitor comprising a noble metal electrode formed on the silicon oxide layer; and
an adhesion layer comprised of Si disposed between and adhering to the noble metal electrode and the silicon oxide layer, the Si adhesion layer deposited on the silicon oxide layer and the noble metal electrode deposited on the Si adhesion layer.

22. The memory device recited in claim 21 wherein the noble metal electrode comprises Pt.

23. The memory device recited in claim 21 wherein the capacitor includes a high-k dielectric layer disposed on the noble metal electrode.

24. The memory device recited in claim 23 wherein the capacitor comprises another electrode disposed on the high-k dielectric layer.

* * * * *

UNITED STATES PATENT AND TRADEMARK OFFICE
CERTIFICATE OF CORRECTION

| | |
|---|---|
| PATENT NO. | : 7,270,884 B2 |
| APPLICATION NO. | : 10/408339 |
| DATED | : September 18, 2007 |
| INVENTOR(S) | : Lian et al. |

It is certified that error appears in the above-identified patent and that said Letters Patent is hereby corrected as shown below:

On the cover page, Sect. (75) Inventors:, delete "Larangeville," and insert --Lagrangeville,--.
On the cover page, Sect. (56) References Cited, U.S. PATENT DOCUMENTS, line 13, delete "2003/0047784" and insert --2003/0047764--.

Signed and Sealed this

Fourth Day of December, 2007

JON W. DUDAS
*Director of the United States Patent and Trademark Office*